(12) United States Patent
Kim (10) Patent No.: US 9,431,076 B2
(45) Date of Patent: Aug. 30, 2016

(54) MEMORY SYSTEM, SEMICONDUCTOR DEVICE AND METHODS OF OPERATING THE SAME

(71) Applicant: SK hynix Inc., Gyeonggi-do (KR)

(72) Inventor: Jee Yul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 203 days.

(21) Appl. No.: 14/075,746

(22) Filed: Nov. 8, 2013

(65) Prior Publication Data

US 2014/0372690 A1 Dec. 18, 2014

(30) Foreign Application Priority Data

Jun. 12, 2013 (KR) ........................ 10-2013-0067298

(51) Int. Cl.
| | |
|---|---|
| G11C 16/26 | (2006.01) |
| G11C 7/10 | (2006.01) |
| G11C 13/00 | (2006.01) |
| G11C 11/56 | (2006.01) |

(52) U.S. Cl.
CPC ......... *G11C 7/1072* (2013.01); *G11C 11/5642* (2013.01); *G11C 13/004* (2013.01); *G11C 16/26* (2013.01); *G11C 2211/5646* (2013.01)

(58) Field of Classification Search
CPC ............... G11C 13/004; G11C 16/26; G11C 2211/5646; G11C 2211/554
See application file for complete search history.

(56) References Cited

U.S. PATENT DOCUMENTS

| | | | | |
|---|---|---|---|---|
| 6,418,515 B1* | 7/2002 | Kurosawa | ........... | G06F 12/0804 711/135 |
| 2005/0141318 A1* | 6/2005 | Lee | ................ | 365/226 |
| 2005/0160217 A1* | 7/2005 | Gonzalez et al. | ................ | 711/6 |
| 2006/0203560 A1* | 9/2006 | Tomita | ............... | G11C 16/0475 365/185.28 |
| 2007/0171711 A1* | 7/2007 | Kang et al. | ............... | 365/185.03 |
| 2008/0175059 A1* | 7/2008 | Kim et al. | ............... | 365/185.12 |
| 2008/0239809 A1* | 10/2008 | Chae et al. | ............... | 365/185.09 |
| 2010/0074025 A1* | 3/2010 | Park et al. | ............... | 365/185.19 |
| 2010/0107021 A1* | 4/2010 | Nagadomi | .......... | G06F 11/1068 714/704 |
| 2010/0135077 A1* | 6/2010 | Kim et al. | .................. | 365/185.2 |
| 2010/0185812 A1* | 7/2010 | Kim | .............................. | 711/109 |
| 2011/0157999 A1* | 6/2011 | Yoon | ...................... | G11C 16/10 365/185.22 |
| 2012/0008397 A1* | 1/2012 | Shin | .................... | G11C 11/5628 365/185.11 |
| 2012/0033498 A1* | 2/2012 | Kim | .................... | G11C 11/5642 365/185.18 |
| 2012/0106247 A1* | 5/2012 | Shin | .................... | G11C 11/5642 365/185.03 |
| 2013/0135928 A1* | 5/2013 | Lee | ........................ | 365/185.03 |
| 2013/0145083 A1* | 6/2013 | Suzuki | ............... | G06F 12/0246 711/103 |
| 2014/0258597 A1* | 9/2014 | Kim | .................... | G11C 11/5642 711/103 |

FOREIGN PATENT DOCUMENTS

KR 1020110001074 1/2011

* cited by examiner

*Primary Examiner* — Jared Rutz
*Assistant Examiner* — Jean Edouard
(74) *Attorney, Agent, or Firm* — IP & T Group LLP (57) ABSTRACT

A memory system, a semiconductor memory device and methods of operating the same may perform a read operation on the basis of flag data stored in a flag register, without reading the flag data stored in a memory array, when performing the read operation, so that a time taken for the read operation may be reduced.

16 Claims, 9 Drawing Sheets

MEMORY SYSTEM, SEMICONDUCTOR DEVICE AND METHODS OF OPERATING THE SAME

CROSS-REFERENCE TO RELATED APPLICATION

The present application claims priority of to Korean patent application number 10-2013-0067298, filed on Jun. 12, 2013, the entire disclosure of which is incorporated herein by reference in its entirety.

BACKGROUND

1. Field of Invention

Various exemplary embodiments of the present invention relate to an electronic device and, more particularly, to a memory system, a semiconductor memory device and methods of operating the memory system and the semiconductor memory device.

2. Description of Related Art

A semiconductor memory device may be classified into a volatile memory device and a nonvolatile memory device.

The volatile memory device typically performs high speed data read and write operations, but the stored data is lost when the power is cut off. The non-volatile memory device operates at relatively lower write and read speeds, but the stored data is preserved even when the power is cut off. Therefore, the non-volatile memory device is used to store data that is to be maintained regardless of power supply. Examples of the non-volatile memory device include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. The Flash memory device may be typically divided into a NOR device and a NAND device.

The flash memory device enjoys the advantages of both RAM and ROM devices. For example, the flash memory device may be freely programmed and erased similar to the RAM device. Similar to the ROM device, the flash memory device may retain the stored data even when it is not powered. The flash memory device has been widely used as the storage media of portable electronic devices such as mobile phones, digital cameras, personal digital assistants (PDAs), and MP3 players.

Recently, as the number of bits of data stored in a single memory cell of a semiconductor memory device has increased, the time taken for a read operation of the semiconductor memory device may be increased.

Therefore, a need arises for an efficient read operation of the semiconductor memory device.

BRIEF SUMMARY

Various exemplary embodiments of the present invention are directed to a memory system, a semiconductor memory device, and a method of operating the same that may efficiently perform a read operation.

A method of operating a memory system according to an embodiment of the present invention may include reading flag data of each word line of memory blocks of a semiconductor memory device, the flag data stored in one of the memory blocks, and storing the flag data in a random-access memory (RAM) outside the semiconductor memory device, reading the flag data in the RAM and storing the flag data in a flag register in the semiconductor memory device, and performing a read operation on memory cells of a selected page in response to a page address on the basis of the flag data stored in the flag register.

A method of operating a memory system according to another exemplary embodiment of the present invention may include checking whether flag data of each word line is stored in a flag register of a semiconductor memory device, performing, at the semiconductor memory device, a most significant bit (MSB) page read operation on a selected word line using a controller suitable for controlling operations of the semiconductor memory device when the flag data is not stored in the flag register, storing flag data, determined by the MSB page read operation, in the flag register, and performing a least significant bit (LSB) page read operation on the selected word line on the basis of the flag data of the selected word line stored in the flag register.

A method of operating a semiconductor memory device according to an exemplary embodiment of the present invention may include reading flag data of each word line of memory blocks, the flag data stored in one of the memory blocks, storing the flag data in a flag register, and performing a read operation on memory cells of a selected page in response to a page address on the basis of the flag data stored in the flag register.

A method of operating a semiconductor memory device according to an exemplary embodiment of the present invention may include checking as to whether flag data is stored in a flag register, performing a least significant bit (LSB) page read operation or a most significant bit (MSB) page read operation on a selected word line in response to a page address when the flag data is not stored in the flag register, storing flag data, determined by the LSB page read operation or the MSB page read operation, in the flag register, and performing the LSB page read operation or the MSB page read operation on the selected word line on the basis of the flag data of the selected word line, stored in the flag register, when the LSB page read operation or the MSB page read operation is re-performed on the selected word line.

A memory system according to an exemplary embodiment of the present invention may include a random access memory (RAM), a semiconductor memory device, wherein the semiconductor memory device includes a memory array including memory blocks and suitable for storing flag data of each word line of the memory blocks in one of the memory blocks, a peripheral circuit suitable for reading the flag data and outputting the flag data to the RAM, and a flag register suitable for storing the flag data, and a controller suitable for generating a read command and a page address and controlling the RAM to store the flag data and allow the flag register to store the flag data stored in the RAM, wherein the peripheral circuit of the semiconductor memory device is suitable for performing a read operation on memory cells of a selected page in response to the read command and the page address, on the basis of the flag data stored in the flag register.

A memory system according to another exemplary embodiment of the present invention may include a semiconductor memory device, wherein the semiconductor memory device includes a memory array including memory blocks and suitable for storing flag data of each word line of the memory blocks in one of the memory blocks, a flag register suitable for storing the flag data, and a peripheral circuit suitable for performing a most significant bit (MSB)

page read operation on a selected word line in response to a read command and an MSB page address, storing flag data determined by the MSB page read operation, in the flag register, and performing a least significant bit (LSB) page read operation on the selected word line in response to a read command and an LSB page address, wherein the LSB page read operation of the selected word line is performed on the basis of the flag data of the selected word line stored in the flag register, and a controller suitable for checking whether the flag data of each word line is stored in the flag register, and outputting an MSB page address of the selected word line and an LSB page address thereof when the flag data is not stored in the flag register.

A semiconductor memory device according to an exemplary embodiment of the present invention may include a memory array including memory blocks and suitable for storing flag data of each word line of the memory blocks in one of the memory blocks, a flag register suitable for storing the flag data, and a peripheral circuit suitable for reading the flag data of each word line and storing the flag data in the flag register, and performing a read operation on memory cells of a selected page on the basis of the flag data stored in the flag register.

A semiconductor memory device according to another exemplary embodiment of the present invention may include a memory array including memory blocks and suitable for storing flag data of each word line of the memory blocks in one of the memory blocks, a flag register suitable for storing the flag data, and a peripheral circuit configured to check as to whether the flag data is stored in the flag register, perform a least significant bit (LSB) page read operation or a most significant bit (MSB) page read operation on a selected word line in response to a page address when the flag data is not stored in the flag register, storing flag data, determined by the LSB page read operation or the MSB page read operation, in the flag register, and performing the LSB page read operation or the MSB page read operation on the selected word line on the basis of the flag data of the selected word line, stored in the flag register, when the LSB page read operation or the MSB page read operation of the selected word line is re-performed.

DESCRIPTION OF EMBODIMENTS

Hereinafter, various exemplary embodiments of the present invention will be described in detail with reference to the accompanying drawings. Throughout the disclosure, reference numerals correspond directly to the like numbered parts in the various figures and embodiments of the present invention. The figures are provided to enable those of ordinary skill in the art to make and use the present invention according to the exemplary embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1:
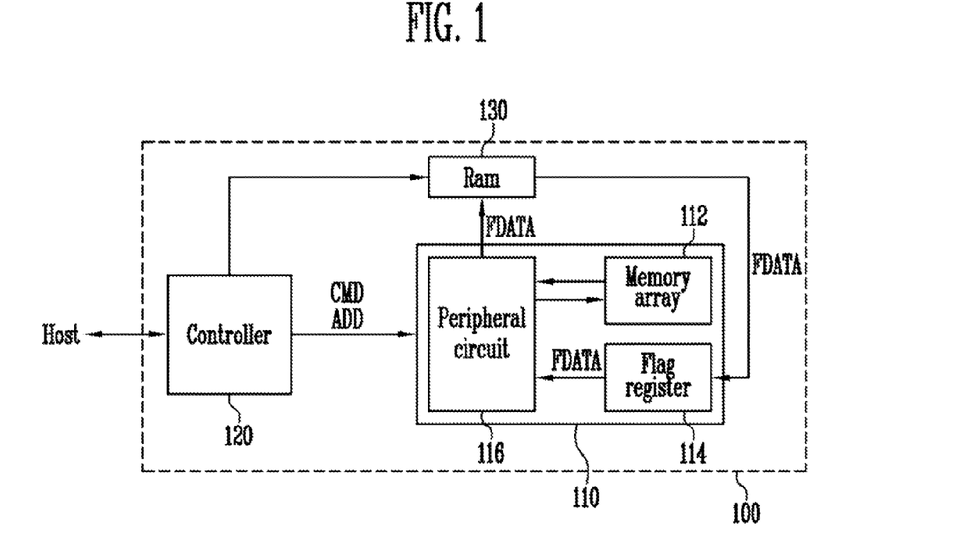
FIG. 1 is a block diagram of a memory system according to an exemplary embodiment of the present invention.

FIG. 1 is a block diagram of a memory system according to an exemplary embodiment of the present invention.

Referring to FIG. 1, a memory system 100 according to an embodiment of the present invention may include a semiconductor memory device 110, a controller 120 and random-access memory (RAM) 130.

The semiconductor memory device 110 may read flag data FDATA of each word line, stored in one of the memory blocks of a memory array 112, and store the flag data FDATA in the RAM 130.

The controller 120 may control the semiconductor memory device 110 by outputting a command CMD and an address ADD in response to a request from a host. The controller 120 may control the semiconductor memory device 110 so that the semiconductor memory device 110 may manage flag data of word lines, included each memory block, each time the semiconductor memory device 110 reads data, and the semiconductor memory device 110 may collect the managed flag data and store the flag data in a page of an arbitrary block among memory blocks.

The controller 120 may control the RAM 130 so that the flag data FDATA, stored in the RAM 130, may be stored in a flag register 114 in the semiconductor memory device 110.

The semiconductor memory device 110 may perform a read operation on memory cells of a selected page in response to a read command and a page address being input from the controller 120 on the basis of the flag data FDATA stored in the flag register 114.

The flag data FDATA of each word line may be stored in the RAM 130 and the flag register 224 when the power is on.

When the flag data of each word line from the semiconductor memory device 110 is stored in the RAM 130, the controller 120 may control the RAM 130 so that flag data of a memory block on which a read operation is performed, among the flag data stored in the RAM 130, may be stored in the flag register 114 based on an address. Therefore, the size of the flag register 114 may be reduced. In this example, the flag data, stored in the flag register 114, may be updated whenever an address of a memory block on which a read operation is performed changes.

The semiconductor memory device 110 may store flag data of a page that includes flag data of a memory block on which a read operation is performed, among the flag data of all word lines, in the RAM 130.

The memory system 100 may store the flag data FDATA first in the RAM 130 and then in the flag register 114. Therefore, since a read operation is performed on the basis of the flag data stored in the flag register 114 without reading the flag data from the memory array 112, the time taken to perform the read operation may be reduced.

Figure 2:
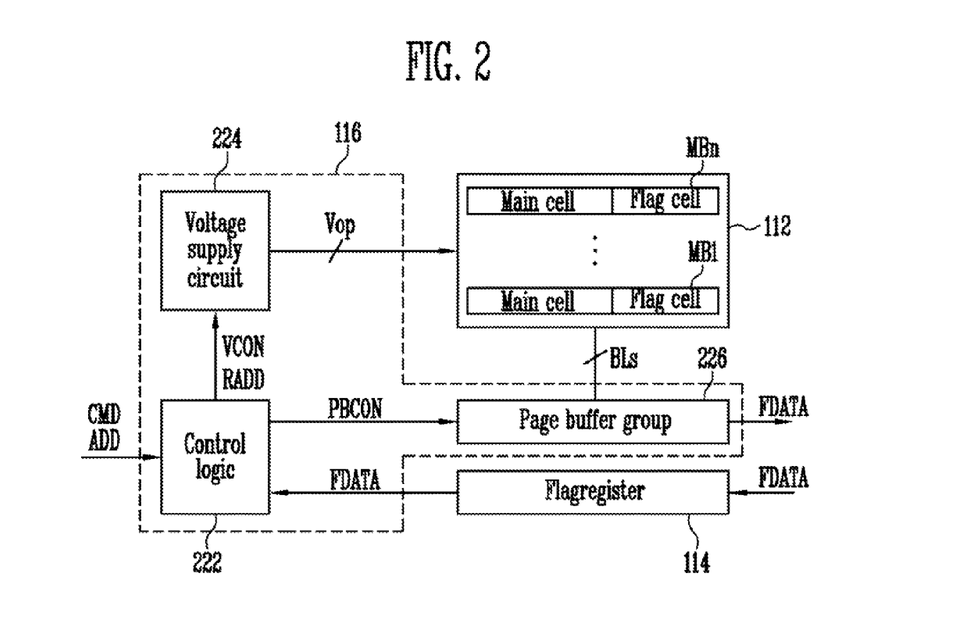
FIG. 2 is a block diagram of a semiconductor memory device of FIG. 1.

FIG. 2 is a block diagram of the semiconductor memory device of FIG. 1.

Referring to FIG. 2, the semiconductor memory device 110 as illustrated in FIG. 1, may include the memory array 112, the flag register 114, and a peripheral circuit 116. The memory array 112 may include a plurality of memory blocks MB1 to MBn, and the flag data FDATA of each word line may be stored in one of the memory blocks. The flag register 114 serves to store the flag data FDATA. The peripheral circuit 116 may read the flag data FDATA of each word line and output the flag data FDATA to the RAM 130 and perform a read operation on memory cells of a selected page in response to a read command and a page address on the basis of the flag data stored in the flag register 114.

The memory blocks MB1 to MBn may include main cells and flag cells. A flag cell may store state information of a word line to which the flag cell is coupled. The state information may include flag information to determine whether only a least significant bit (LSB) page of main cells, coupled to a word line, is programmed (i.e., whether 1-bit data is stored) or a most significant bit (MSB) page thereof is programmed (i.e., whether 2-bit data is stored). A read voltage level may be determined by the flag information during a read operation of each word line.

Though not illustrated in FIG. 2, each of the memory blocks may include a plurality of strings that are coupled between bit lines and a common source line. In other words, each of the strings may be coupled to the corresponding bit line and the strings may be also coupled in common to the common source line. Each of the strings may include a source selection transistor having a source coupled to the common source line, a plurality of memory cells, and a drain selection transistor having a drain coupled to a bit line. The memory cells may be coupled in series between the selection transistors. A gate of the source select transistor may be coupled to a source selection line, gates of the memory cells may be respectively coupled to the word lines, and a gate of the drain select transistor may be coupled to a drain selection line.

Memory cells, included in a memory block, may be divided on a basis of a physical page unit or a logical page unit. For example, memory cells coupled to a single word line may form a single physical page. In addition, even-numbered memory cells coupled to a single word line may form a single even physical page, and odd-numbered memory cells may be form a single odd physical page. A physical page or an even physical page and an odd physical page may be a basic unit for a program operation or a read operation. Data, stored in memory cells coupled to a word line, may form a logical page. In other words, when n-bit data is stored in each memory cell, n logical pages may be formed. According to an embodiment of the present invention, a description will be made in reference to an example in which memory cells, coupled to a single word line, form one physical page and two logical pages.

The peripheral circuit 116 may perform a read operation by using a first read voltage when flag data of a selected word line is first data, and may perform the read operation by using a second read voltage when the flag data is second data, in response to an LSB page address which is included in the read command and a row address RADD.

The peripheral circuit 116 may perform the read operation by using the first read voltage and a third read voltage when the flag data is the second data, in response to an MSB page address which is included in the read command and the row address RADD.

The peripheral circuit 116 may include a control logic 222, a voltage supply circuit 224, and a page buffer group 226.

The control logic 222 may generate and output a voltage control signal VCON in order to generate voltages for a program operation, a verify operation or a read operation, and the row address RADD in order to determine a word line on which the program operation, the verify operation or the read operation is performed, in response to the command CMD and the address ADD, which are output from the controller 120. In addition, the control logic 222 may output page buffer (PB) control signals PBCON in order to control page buffers included in the page buffer group 226, according to operation type.

The voltage supply circuit 224 may apply operating voltages Vop for a program operation and a read operation of memory cells of a selected memory block onto local lines including a drain selection line, word lines and a source selection line in response to the voltage control signal VCON and the row address RADD from the control logic 222. The voltage supply circuit 224 may include a voltage generation circuit and a row decoder (not shown).

The voltage generation circuit may output the operating voltages Vop for the program operation or the read operation of the memory cells onto global lines in response to the voltage control signal VCON from the control logic 222. For example, the voltage generation circuit (not shown) may output a program voltage to be applied to the memory cells of the selected page and a pass voltage to be applied to unselected memory cells to the global lines in order to perform a program operation. The voltage generation circuit may output a read voltage to be applied to the memory cells of the selected page and a pass voltage to be applied to the unselected memory cells to the global lines in order to perform a read operation.

The row decoder (not shown) may couple the global lines and the local lines in response to a row address signal RADD from the control logic 222 so that operating voltages, which is output onto the global lines from the voltage generation circuit, may be transferred from the memory array 112 to the local lines of the selected memory block MB. In this manner, the program voltage or the read voltage may be applied to a local word line coupled to a selected cell through a global word line from the voltage generation circuit. In addition, the pass voltage may be applied to local word lines coupled to unselected cells through global word lines from the voltage generation circuit. As a result, data may be stored in the selected cell by the program voltage, or data, stored in the selected cell, may be read by the read voltage.

The page buffer group 226 may include a plurality of page buffers that are coupled to the memory array 112 through bit lines BLs. The page buffers of the page buffer group 226 may read and temporarily store the flag data FDATA stored in each flag cell, and store the flag data FDATA in one of the memory blocks, in response to the PB control signal PBCON of the control logic 222. In addition, the page buffers may read and temporarily store the flag data FDATA stored in one of the memory blocks, and output the flag data FDATA to the RAM, in response to the PB control signal PBCON of the control logic 222 when the power is on.

Figure 3:
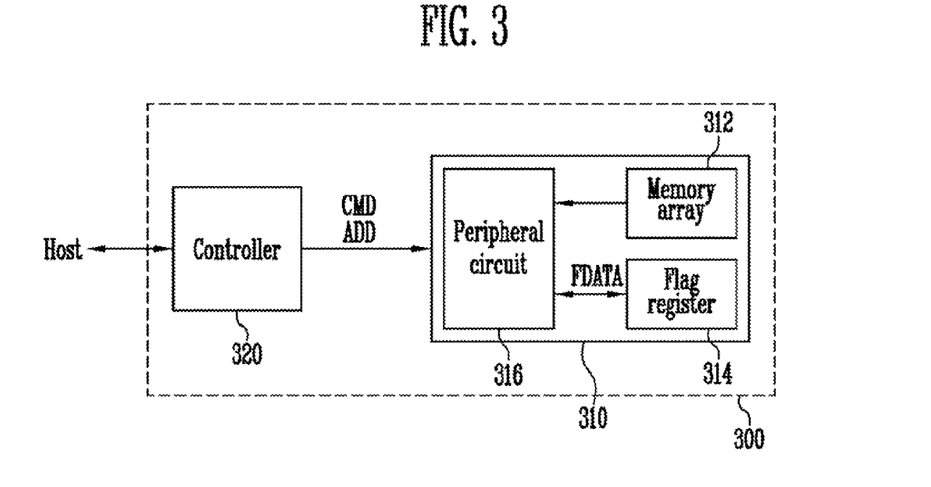
FIG. 3 is a block diagram of a memory system according to another exemplary embodiment of the present invention.

FIG. 3 is a block diagram of a memory system according to another exemplary embodiment of the present invention.

Referring to FIG. 3, a memory system 300 may include a semiconductor memory device 310 and a controller 320. The semiconductor memory device 310 may include a memory array 312, a flag register 314, and a peripheral circuit 316.

Since the memory array 312 and the flag register 314 have substantially the same configurations as the memory array 112 and the flag register 114 as illustrated in FIG. 1, respectively, a detailed description thereof will be omitted.

The peripheral circuit 316 may perform an MSB page read operation on a selected word line in response to a read command and an MSB page address, store the flag data FDATA determined by the MSB page read operation in the flag register 314, and perform an LSB page read operation on the selected word line in response to a read command and an LSB page address. The peripheral circuit 316 may perform the LSB page read operation on the selected word line on the basis of the flag data FDATA of the selected word line stored in the flag register 314.

The controller 320 may output the command CMD and the address ADD to control the semiconductor memory device 310 in response to a request from a host. The controller 320 may check whether the flag data of each word line is stored in the flag register 314. When the flag data is not stored in the flag register 314, the controller 320 may output the MSB page address of the selected word line and subsequently output the LSB page address. When the flag data FDATA is stored in the flag register 314, the controller 320 may output the read command and the LSB page address.

The peripheral circuit 316 may perform an MSB page read operation by using a first read voltage and store the read data as the flag data of the selected word line in the flag register 314, in response to the read command and the MSB page address.

The peripheral circuit 316 may check the flag data of the selected word line, stored in the flag register 314; perform a read operation by using a first read voltage when the flag data of the selected word line is first data; and perform the read operation by using a second read voltage when the flag data of the selected word line is second data, in response to the read command and the LSB page address.

In the memory system 300, as illustrated in FIG. 3, the controller 320 may perform the MSB page read operation when the flag data FDATA is not stored in the flag register 314, store the flag data determined by the MSB page read operation, in the flag register, and control the semiconductor memory device 310 to perform the LSB page read operation on the basis of the flag data stored in the flag register. As a result, unlike the memory system 100, as illustrated in FIG. 1, in which the flag data is stored in the RAM 130, the time taken for the LSB page read operation may be reduced.

Figure 4:
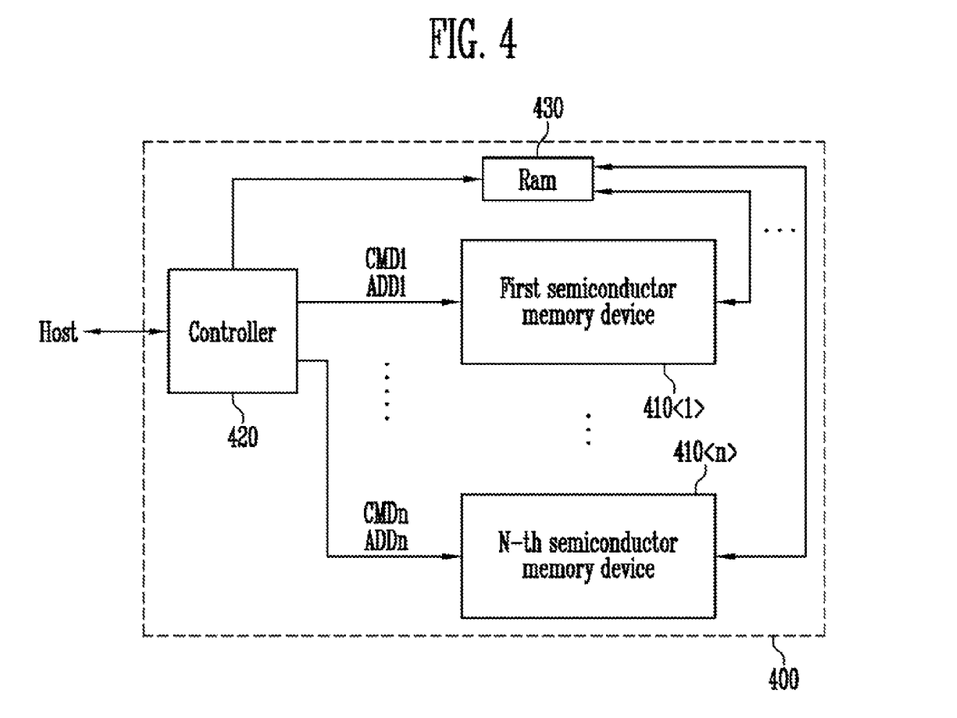
FIG. 4 is a block diagram of a memory system according to yet another exemplary embodiment of the present invention.

FIG. 4 is a block diagram of a memory system according to yet another exemplary embodiment of the present invention.

Referring to FIG. 4, a memory system 400 may include first to n-th semiconductor memory devices 410<1> to 410<n>, a controller 420, and a RAM 430, where n is a positive integer.

The semiconductor memory devices 410<1> to 410<n> may read the flag data FDATA of each word line, which is stored in one of the memory blocks, and store the flag data FDATA in the RAM 430.

The controller 420 may output commands CMD1 to CMDn and addresses ADD1 to ADDn to control the first to n-th semiconductor memory devices 410<1> to 410<n>, respectively, in response to a request from a host. The controller 420 may control the RAM 430 so that the flag data, stored in the RAM 430, may be stored in a flag register (not shown in FIG. 4) in each of the first to n-th semiconductor memory devices 410<1> to 410<n>.

The first to n-th semiconductor memory devices 410<1> to 410<n> may perform a read operation on memory cells of a selected page in response to a read command and a page address, input from the controller 420, on the basis of the flag data stored in the flag register.

Since configurations of the other elements of the memory system 400 are substantially the same as those of the memory system of FIG. 1 except that the controller 420 controls the plurality of memory devices. For the sake of convenience, any further description thereof will be omitted.

The memory system 400, as illustrated in FIG. 4, may reduce the time taken for the plurality of semiconductor memory devices to perform a read operation since the semiconductor memory devices perform the read operation on the basis of the flag data stored in the flag register, without reading the flag data from the memory array 112.

Figure 5:
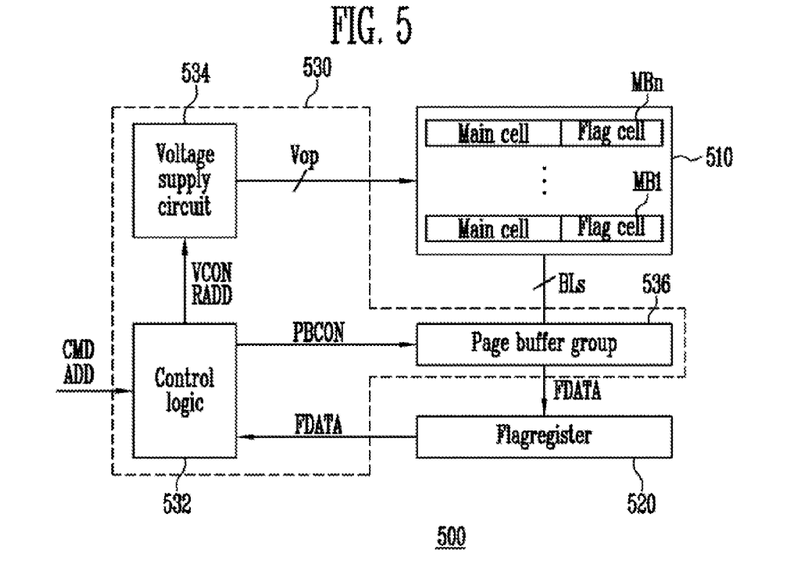
FIG. 5 is a block diagram of a semiconductor memory device according to an exemplary embodiment of the present invention.

FIG. 5 is a block diagram of a semiconductor memory device according to an exemplary embodiment of the present invention.

Referring to FIG. 5, a semiconductor memory device 500 may include a memory array 510, a flag register 520, and a peripheral circuit 530.

The memory array 510 may include memory blocks MB1 to MBn. Flag data of each word line may be stored in one of the memory blocks.

The flag register 520 may store the flag data FDATA.

The peripheral circuit 530 may read the flag data of each word line and store the flag data in the flag register 520. The peripheral circuit 530 may perform a read operation on memory cells of a selected page on the basis of the flag data FDATA stored in the flag register 520.

The peripheral circuit 530 may read the flag data FDATA from the memory array 510 and store the flag data FDATA in the flag register 520 when the power is on.

The peripheral circuit 530 may read flag data of a memory block on which a read operation is performed, among the flag data of all word lines, stored in the one memory block, and store the flag data in the flag register 520.

The peripheral circuit 530 may perform a read operation by using a first read voltage when the flag data FDATA of the selected word line is first data, and may perform the read operation by using a second read voltage when the flag data FDATA is second data, in response to a read command and an LSB page address.

The peripheral circuit 530 may perform the read operation by using first and third read voltages when the flag data FDATA is second data in response to the read command and an MSB page address.

The peripheral circuit 530 may include a control logic 532, a voltage supply circuit 534, and a page buffer group 536.

The control logic 532, the voltage supply circuit 534, and the page buffer group 536 may have substantially the same configurations as the control logic 222, the voltage supply circuit 224, and the page buffer group 226 of FIG. 2, respectively. Thus, a detailed description thereof will be omitted.

However, the page buffer group 536 may read and temporarily stores the flag data FDATA stored in one memory block, and output the flag data FDATA to the flag register 520 in response to the PB control signal PBCON of the control logic 532.

The semiconductor memory device 500 of FIG. 5 may store the flag data FDATA in the flag register 520 in the semiconductor memory device 500. Therefore, a separate RAM for storing flag data or control operation for controlling the separate RAM provided by a controller may not be required. The semiconductor memory device 500 may perform a read operation on the basis of the flag data stored in the flag register 114, without reading the flag data from the memory array 112. Therefore, the time taken for the read operation may be reduced without a separate RAM for storing flag data or a control operation for controlling the separate RAM by the controller.

In the semiconductor memory device 500, the peripheral circuit 530 may determine whether the flag register 520 stores the flag data FDATA. When the flag data is not stored in the flag register 520, an LSB page read operation or an MSB page read operation may be performed on a selected word line in response to a page address. The flag data, determined by the LSB page read operation or the MSB page read operation, may be stored in the flag register 520. The LSB page read operation or the MSB page read operation of the selected word line may be performed again on the basis of the flag data of the selected word line stored in the flag register 520.

When the peripheral circuit 530 re-performs the LSB page read operation on the selected word line, the peripheral circuit 530 may check the flag data FDATA of the selected word line stored in the flag register 520. When the flag data FDATA of the selected word line is first data, the peripheral circuit 530 may perform a read operation by using a first read voltage. When the flag data FDATA of the selected word line is second data, the peripheral circuit 530 may perform the read operation by using a second read voltage.

When the peripheral circuit 530 re-performs the MSB page read operation of the selected word line, the peripheral circuit 530 may check the flag data FDATA of the selected word line, which is stored in the flag register 520, and perform the read operation by using first and third read voltages when the flag data FDATA of the selected word line is second data.

Therefore, the time taken for the read operation may be reduced even when the flag data of each word line is not previously stored in the flag register.

Figure 6:
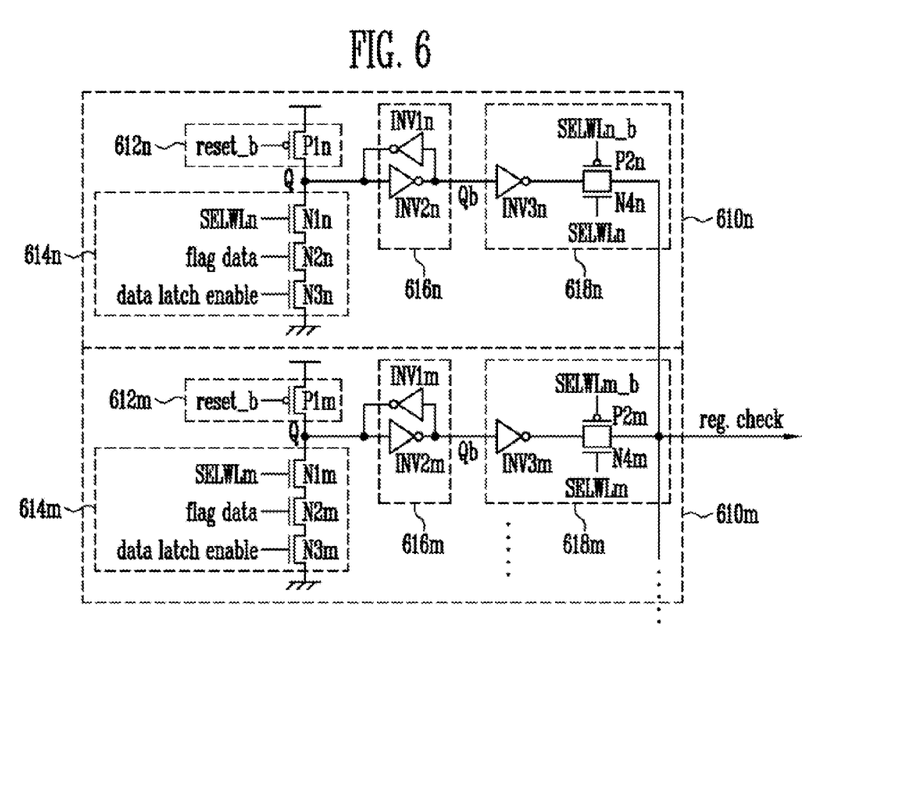
FIG. 6 is a detailed circuit diagram of a flag resister as shown in FIGS. 1 to 3 and 5.

FIG. 6 is a detailed circuit diagram of the flag register illustrated in FIGS. 1 to 3 and 5.

Referring to FIG. 6, a flag register may include a plurality of storages 610$n$, 610$m$. Each of the storages may include an initialization unit 612$m$, 612$n$, a data setting unit 614$m$, 614$n$, a latch unit 616$m$, 616$n$, and a data output unit 618$m$, 618$n$, where m is a positive integer.

For example, an initialization unit 612$n$ of an n-th storage may initialize the stored data in response to an initialization signal reset_b. The initialization unit 612$n$ may include a first PMOS transistor P1$n$. The first PMOS transistor P1$n$ may be coupled between a power terminal and a data node Q and may couple the power terminal to the data node Q in response to the initialization signal reset_b having a low level. The initialization unit 612$n$ may initialize data with high-level data in response to the initialization signal reset_b at the low level.

The data setting unit 614$n$ may set flag data of a word line WLn in response to a word line selection signal SELWLn, a data latch enable signal, and a flag data signal. The data setting unit 614$n$ may include first to third NMOS transistors N1$n$ to N3$n$. The first to third NMOS transistors N1$n$ to N3$n$ may be coupled in series between the data node Q and a ground terminal and may couple the data node Q to the ground terminal in response to the word line selection signal SELWLn, the data latch enable signal, and the flag data signal. The data setting unit 614$n$ may set the flag data of the word line WLn by discharging the data node Q in response to the word line selection signal SELWLn, the data latch enable signal, and the flag data signal having high levels.

The latch unit 616$n$ may latch the set flag data. The latch unit 616$n$ may include a latch coupled between the data node Q and the inversion data node Qb. The latch may include first and second inverters INV1$n$ and INV2$n$.

The data output unit 618$n$ may output the latched flag data to the peripheral circuit in response to the word line selection signal SELWLn. The data output unit 618$n$ may include a third inverter INV3$n$, a fourth NMOS transistor N4$n$ and a second PMOS transistor P2$n$. The third inverter INV3$n$ may be coupled to an inversion data node Qb and configured to invert data. The fourth NMOS transistor may be coupled between the third inverter INV3$n$ and an output node reg.check and configured to transfer the data, which is inverted by the third inverter INV3$n$, to the output node reg.check in response to the word line selection signal SELWLn and an inverting word line selection signal SELWLn_b.

The flag register including the above-described configuration may invert and output the flag data. When the flag data is high-level data of '1,' low-level data may be output. When the flag data is low-level data of '0,' high-level data may be output.

Figure 7:
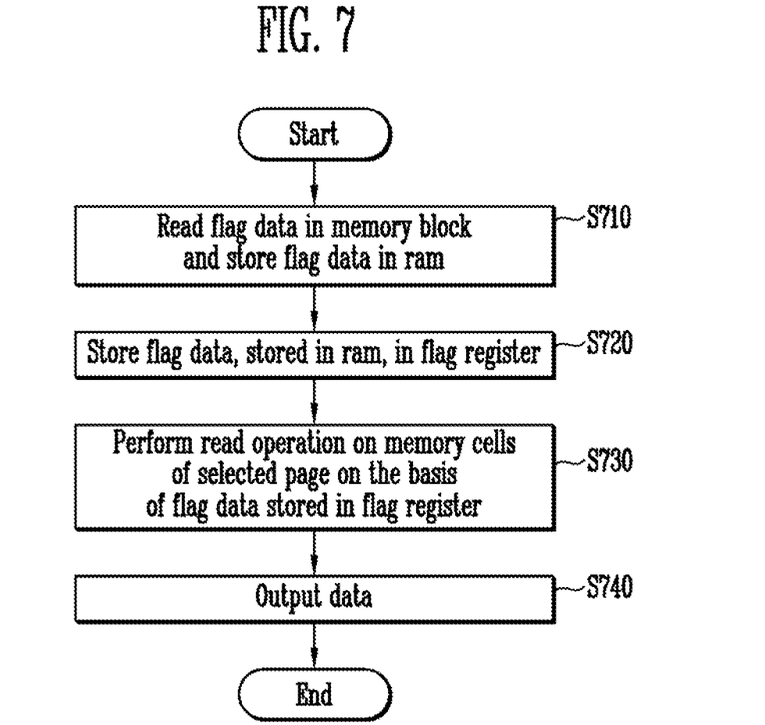
FIG. 7 is a flowchart illustrating a method of operating a memory system according to an exemplary embodiment of the present invention.

FIG. 7 is a flowchart illustrating a method of operating a memory system according to an exemplary embodiment of the present invention.

Referring to FIG. 7, according to a method of operating a memory system according to an exemplary embodiment of the present invention, flag data of each word line, which is stored in one of the memory blocks of a semiconductor memory device, may be read and stored in a RAM outside the semiconductor memory device at step S710.

Subsequently, the flag data stored in the RAM may be stored in a flag register in the semiconductor memory device at step S720.

Steps S710 and S720 may be performed when the power is on.

Subsequently, a read operation may be performed on memory cells of a selected page in response to a page address on the basis of the flag data stored in the flag register at step S730.

Lastly, the read data may be output at step S740.

According to the method of operating a memory system as described above, since a read operation is performed on the basis of the flag data stored in the flag register without reading the flag data from a memory block, the time taken for the read operation may be reduced.

Figure 8:
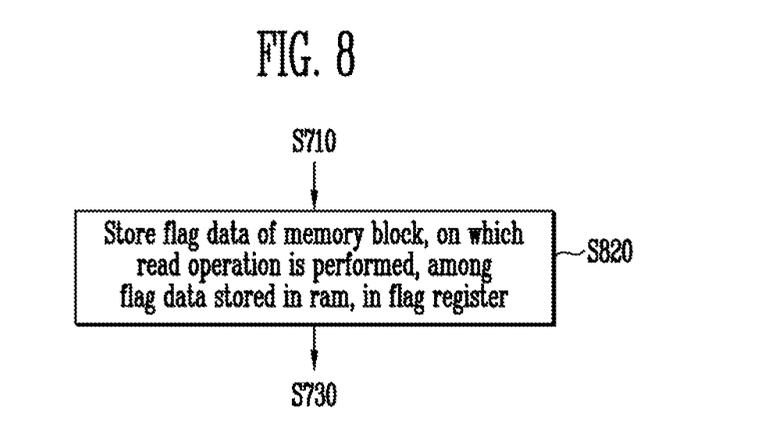
FIG. 8 is a flowchart illustrating a method of operating a memory system according to another exemplary embodiment of the present invention.

FIG. 8 is a flowchart illustrating a method of operating a memory system according to another exemplary embodiment of the present invention.

Referring to FIG. 8, according to a method of operating a memory system according to another exemplary embodiment of the present invention, when the flag data stored in the RAM is stored in the flag register in the semiconductor memory device after step S710, flag data of a memory block on which a read operation is performed, among the flag data stored in the RAM, may be stored in the flag register at step S820.

According to the method of operating a memory system as described above, the size of the flag register may be reduced since it may not be necessary to store the flag data of every word line in the flag register.

The size of the RAM may be reduced by storing data of a page, including the flag data of the memory block on which the read operation is performed, in the RAM when the flag data of each word line is read and stored in the RAM outside the semiconductor memory device at step S710.

Figure 9:
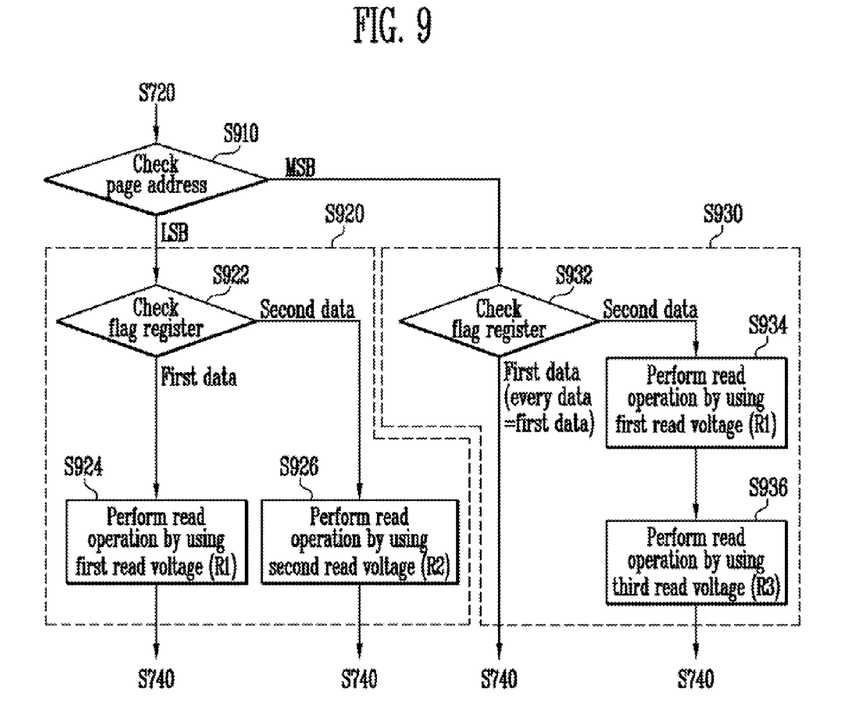
FIG. 9 is a flowchart illustrating a detailed procedure of step 730 as illustrated in FIG. 7.

FIG. 9 is a flowchart illustrating a detailed process of step 730.

Referring to FIG. 9, after step S720, a page address may be checked among addresses, which is input to the semiconductor memory device from the controller, at step S910.

When the page address input from the controller is an LSB page address, an LSB page read operation may be performed at step S920. When the page address input from the controller is an MSB page address, an MSB page read operation may be performed at step S930.

During the LSB page read operation, the flag data of the selected word line, which is stored in the flag register, may be checked at step S922.

When the flag data of the selected word line is first data, a read operation may be performed using a first read voltage R1 at step S924. When the flag data of the selected word line is second data, a read operation may be performed using a second read voltage R2 at step S926.

During the MSB page read operation, the flag data of the selected word line, which is stored in the flag register, may be checked at step S932.

When the flag data of the selected word line is first data, every data may be output as the first data. When the flag data of the selected word line is second data, the read operation may be performed using the first and third read voltages at step S934 and S936.

Figure 10:
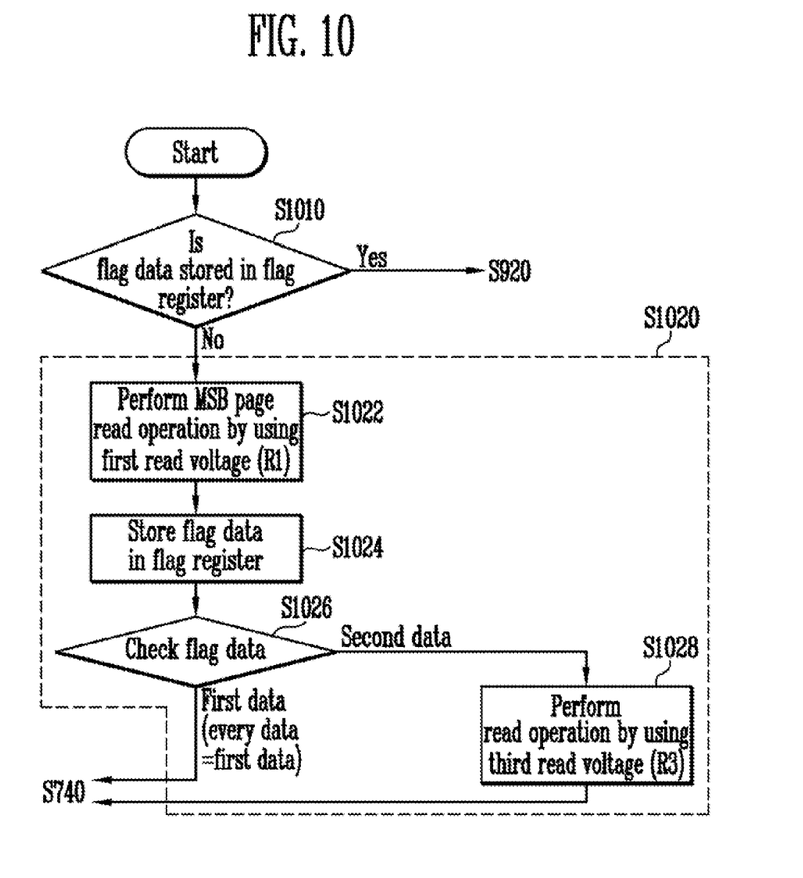
FIG. 10 is a flowchart illustrating a method of operating a memory system according to another exemplary embodiment of the present invention.

FIG. 10 is a flowchart illustrating a method of operating a memory system according to yet another exemplary embodiment of the present invention.

Referring to FIG. 10, according to a method of operating a memory system according to yet another embodiment of the present invention, it may be checked as to whether or not flag data of each word line is stored in a flag register of a semiconductor memory device at step S1010.

When the flag data is not stored in the flag register, the semiconductor memory device may perform an MSB page read operation on a selected word line by a controller configured to control operations of the semiconductor memory device at step S1020.

During an MSB page read operation, a read operation may be performed using a first read voltage at step S1022, and flag data determined by the read operation may be stored in the flag register at step S1024.

Subsequently, the flag data may be checked at step S1026.

When the flag data is first data, every data may be first data, and the process proceeds to step S740. When the flag data is second data, the read operation may be performed using a third read voltage R3 at step S1028, and the process proceeds to step S740.

When the flag data is stored in the flag register at step S1010, the process may proceed to step S920, at which the LSB page read operation may be performed on the selected word line on the basis of the flag data of the selected word line stored in the flag register.

When the flag data is stored in the flag register at step S1010, the process proceeds to step S920.

According to the above-described method of operating a memory system according to yet another exemplary embodiment of the present invention, since the flag data is stored in the flag register by performing the MSB page read operation on the selected word line, and the LSB page read operation is performed on the selected word line on the basis of the stored flag data, the time taken for the LSB page read operation may be reduced without storing the flag data in the RAM.

Figure 11:
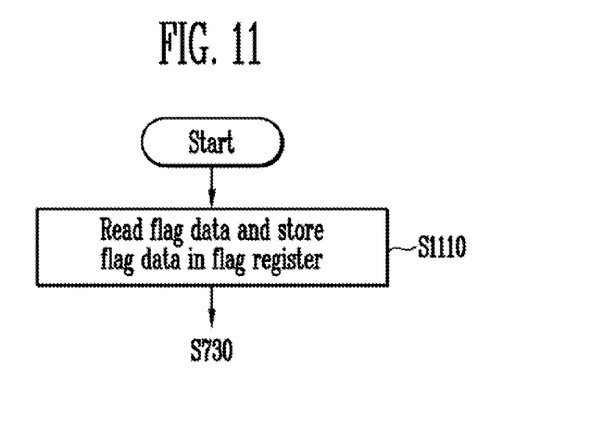
FIG. 11 is a flowchart illustrating a method of operating a semiconductor memory device according to an exemplary embodiment of the present invention.

FIG. 11 is a flowchart illustrating a method of operating a semiconductor memory device according to an exemplary embodiment of the present invention.

Referring to FIG. 11, according to a method of operating a semiconductor memory device according to an embodiment of the present invention, flag data of each word line, which is stored in one of the memory blocks, may be read and stored in a flag register at step S1110.

The flag data of each word line may be read and stored in the flag register when the power is on.

Subsequently, the process may proceed to step S730, at which a read operation may be performed on memory cells of a selected page in response to a page address on the basis of the flag data stored in the flag register.

According to the above-described method of operating a semiconductor memory device, flag data may be stored in the flag register in the semiconductor memory device. Therefore, a separate RAM for storing the flag data therein or control operation for controlling the RAM by a controller may not be required. A read operation of the semiconductor memory device may be performed on the basis of the flag data stored in the flag register, without reading the flag data from the memory array. Therefore, the time taken for the read operation may be reduced without a separate RAM for storing flag data or control operation for controlling the RAM by a controller.

Figure 12:
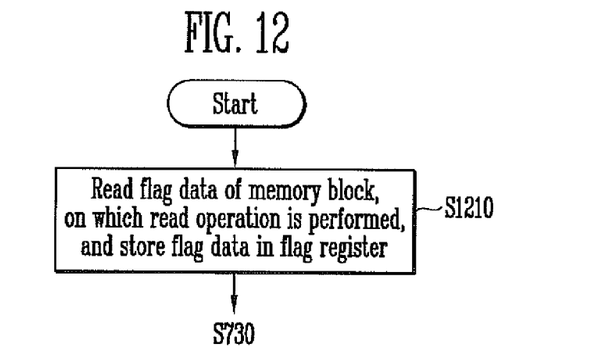
FIG. 12 is a flowchart illustrating a method of operating a semiconductor device according to another exemplary embodiment of the present invention.

FIG. 12 is a flowchart illustrating a method of operating a semiconductor memory device according to another exemplary embodiment of the present invention.

Referring to FIG. 12, according to a method of operating a semiconductor memory device in accordance with another embodiment of the present invention, when flag data of each word line, which is stored in one of the memory blocks, is read and stored in a flag register in the semiconductor memory device, flag data of a memory block on which a read operation is performed, among the flag data of all word lines, may be stored in the flag register at step S1210.

Subsequently, the process proceeds to step S730, at which a read operation may be performed on memory cells of a selected page in response to a page address on the basis of the flag data stored in the flag register.

According to the above-described method of operating a memory system, since it may not be necessary to store flag data of every word line in the flag register, the size of the flag register may be reduced.

Figure 13:
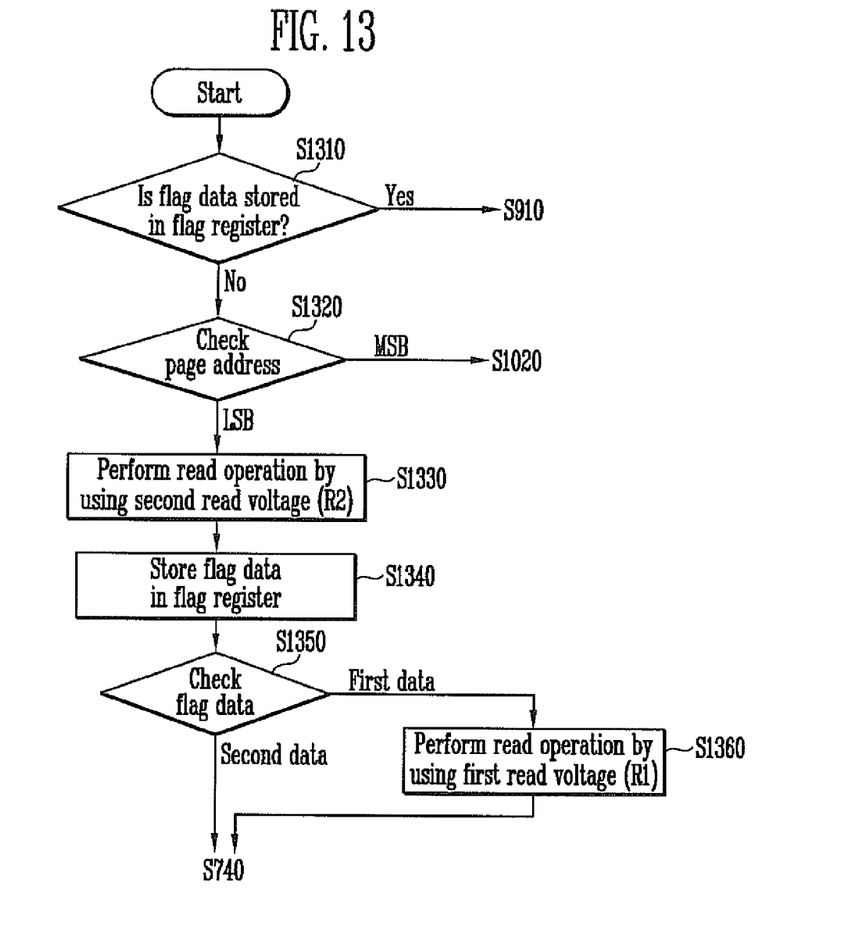
FIG. 13 is a flowchart illustrating a method of operating a semiconductor memory device according to yet another exemplary embodiment of the present invention.

FIG. 13 is a flowchart illustrating a method of operating a semiconductor memory device according to yet another exemplary embodiment of the present invention.

Referring to FIG. 13, according to a method of operating a semiconductor memory device in accordance with yet another exemplary embodiment of the present invention, it may be checked as to whether flag data is stored in a flag register at step S1310.

When the flag data is not stored in the flag register, a page address may be checked at step S1320.

Subsequently, an LSB page read operation or an MSB page read operation may be performed on a selected word line in response to the page address. When the page address is an MSB page address, the process proceeds to step S1020 at which the MSB page read operation is performed.

When the page address is an LSB page address, an LSB page read operation may be performed. During the LSB page read operation, a read operation may be performed using the second read voltage R2 at step S1330, and flag data determined by the read operation may be stored in the flag register at step S1340.

Subsequently, the flag data may be checked at step S1350.

When the flag data is second data, the process proceeds to step S740. When the flag data is first data, a read operation may be performed using the first read voltage R1 at step S1360, and the process proceeds to step S740.

When the flag data is stored in the flag register at step S1020 or at step S1340, the process may proceed to step S910, at which an LSB page read operation or an MSB page read operation may be performed on a selected word line on the basis of the flag data of the selected word line stored in the flag register.

Therefore, even when the flag data of the selected word line is not stored in the flag register, if the LSB page read operation or the MSB page read operation is re-performed on the selected word line, the LSB page read operation or the MSB page read operation of the selected word line may be performed on the basis of the flag data of the selected word line, which is stored in the flag register.

When the flag data is stored in the flag register at step S1310, the process proceeds to step S910, at which the LSB page read operation or the MSB page read operation may be performed on the selected word line on the basis of the flag data of the selected word line.

According to the above-described method of operating a semiconductor memory device, the time taken for a read operation may be reduced even when the flag data of each word line is not previously stored in the flag register.

Figure 14:
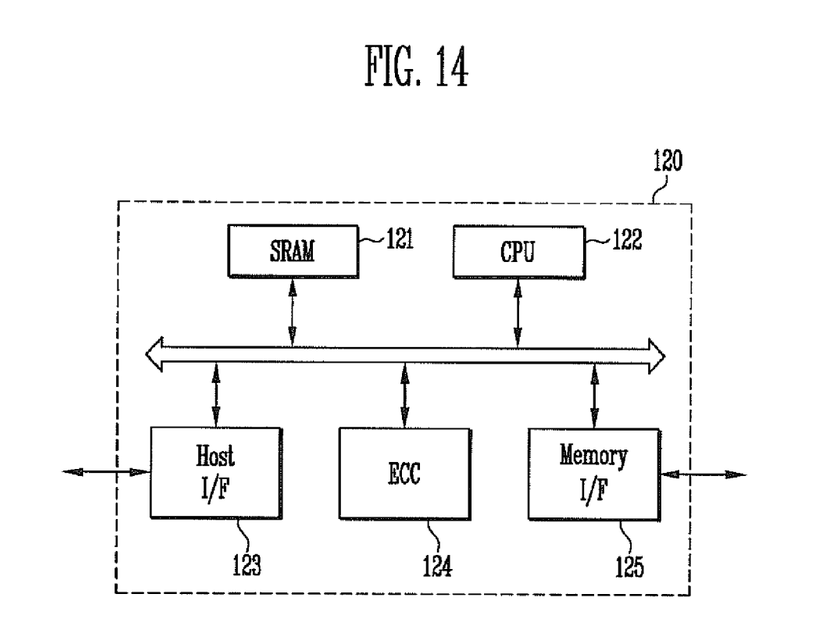
FIG. 14 is a detailed block diagram illustrating a controller of FIG. 1.

FIG. 14 is a detailed block diagram illustrating the controller of FIG. 1.

The memory system 100, as illustrated in FIG. 1, may be a solid state disk (SSD) or a memory card in which the semiconductor memory device 110 and the controller 120 are combined.

Referring to FIG. 14, the controller 120 may include SRAM 121, a CPU 122, a host interface (I/F) 123, an error checking & correction (ECC) 124, and a memory interface (I/F) 125. The SRAM 121 may function as an operation memory of the CPU 122. The host interface 123 may include a data exchange protocol of a host being coupled to the memory system 100. In addition, the ECC 124 may detect and correct errors included in a data read from the non-volatile memory device 120. The memory interface 125 may interface with the non-volatile memory device 120. The CPU 122 may perform the general control operation for data exchange of the memory controller 120.

Though not illustrated in FIG. 14, the memory system 100 may also include ROM (not illustrated) that stores code data to interface with the host. The semiconductor memory device 110 may be a multi-chip package composed of a plurality of flash memory chips. The memory system 100 may be provided as a storage medium having high reliability and low error rate. The flash memory device according to an embodiment of the present invention may be provided in a memory system such as a semiconductor disk device, e.g., a solid state disk (SSD), on which research has been actively conducted. For example, when the memory system 100 is an SSD, the memory controller 120 may communicate with an external source, e.g., a host, through one of the interface protocols including USB, MMC, PCI-E, SATA, PATA, SCSI, ESDI, and IDE.

Figure 15:
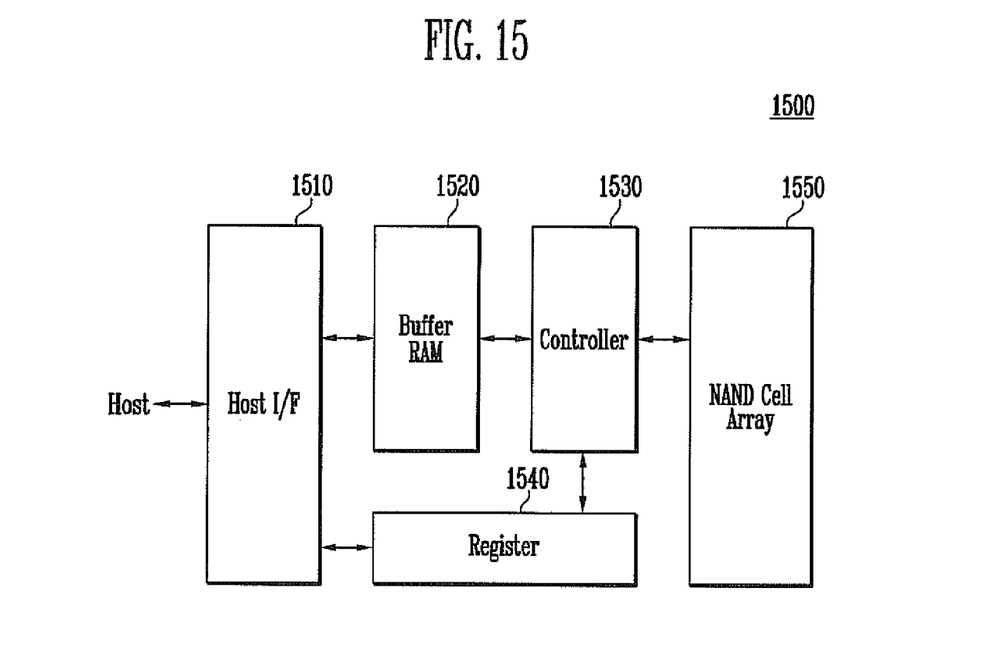
FIG. 15 is a schematic block diagram of a fusion memory device or a fusion memory system configured to perform a program operation according to the aforementioned various embodiments of the present invention.

FIG. 15 is a schematic block diagram of a fusion memory device or a fusion memory system that performs a program operation according to the aforementioned various embodiments. For example, technical features of the present invention may be applied to an OneNand flash memory device 1500 as the fusion memory device.

The OneNand flash memory device 1500 may include a host interface (I/F) 1510, a buffer RAM 1520, a controller 1530, a register 1540, and a NAND flash cell array 1550. The host interface 1510 may be configured to exchange various types of information with a device through a different protocol. The buffer RAM 1520 may have built-in codes for driving the memory device or temporarily store data. The controller 1530 may be configured to control read and program operations and every state in response to a control signal and a command that are externally given. The register 1540 may be configured to store data including instructions, addresses, and configurations defining a system operating environment in the memory device. The NAND flash cell array 1550 may include operating circuits including non-volatile memory cells and page buffers. In response to a write request from a host, the OneNAND flash memory device 1500 may program data in the aforementioned manner.

Figure 16:
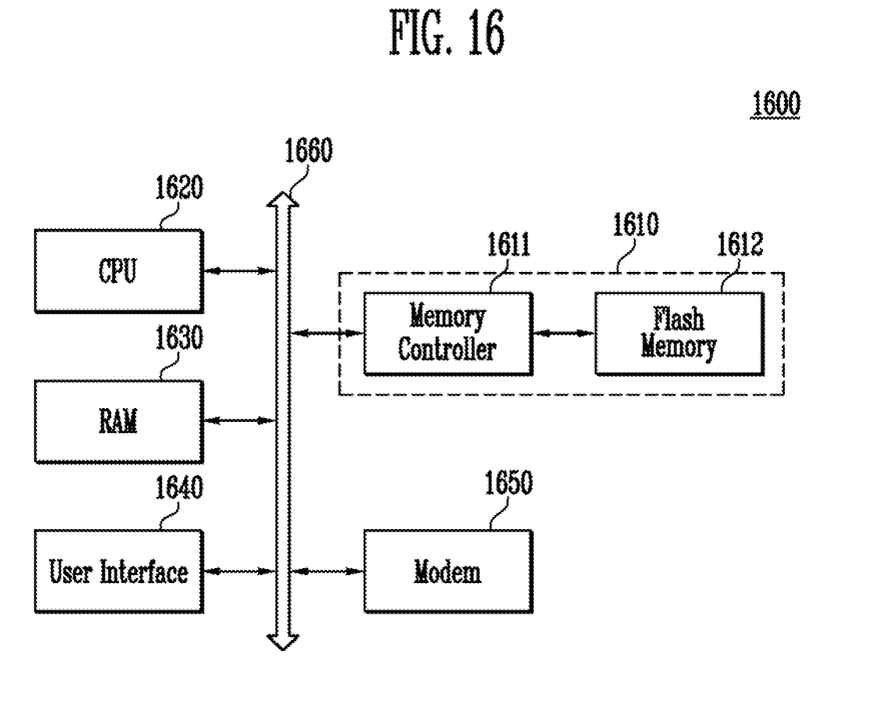
FIG. 16 is a schematic block diagram of a computing system including a flash memory device according to an exemplary embodiment of the present invention.

FIG. 16 is a schematic block diagram of a computing system including a flash memory device 1612 according to an exemplary embodiment of the present invention.

A computing system 1600 according to an embodiment of the present invention may include a microprocessor (CPU) 1620, RAM 1630, a user interface 1640, a modem 1650, such as a baseband chipset, and a memory system 1610 that are electrically coupled to a system bus 1660. In addition, if the computing system 1600 is a mobile device, then a battery may be provided to apply operating voltages to the computing system 1600. Though not shown in FIG. 16, the computing system 1600 may further include application chipsets, a Camera Image Processor (CIS), or mobile DRAM. The memory system 1610 may be a Solid State Drive/Disk (SSD) that uses a non-volatile memory to store data. The memory system 1610 may be provided as a fusion flash memory, e.g., OneNAND flash memory.

It will be apparent to those skilled in the art that the above exemplary embodiments of the present invention may be implemented by a program or a recording medium, in which the program is recorded, configured to perform functions corresponding to the constitution of the embodiments, as well as the apparatus and method disclosed herein.

According to a memory system, a semiconductor memory device and a method of operating the same according to embodiments of the present invention, since a read operation is performed on the basis of flag data stored in a flag register without reading flag data stored in a memory array, a time taken for the read operation may be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of operating a memory system, the method comprising:
    storing a flag data, read from one memory block among a plurality of memory blocks, in a random-access memory (RAM) outside a semiconductor memory device;
    storing the flag data, read from the RAM, in a flag register in the semiconductor memory device; and
    performing a read operation on memory cells of a selected page in response to a page address on the basis of the flag data stored in the flag register,
    wherein the flag data is used for determining a read voltage for the read operation, and
    wherein the one memory block includes the flag data for each word line of the plurality of memory blocks.

2. The method of claim 1, wherein the performing of the read operation comprises:
    checking flag data of a selected word line, stored in the flag register, when a least significant bit (LSB) page read operation is performed on the selected word line; and
    performing a read operation by using a first read voltage when the flag data of the selected word line is first data, and performing the read operation by using a second read voltage when the flag data of the selected word line is second data.

3. The method of claim 1, wherein the performing of the read operation comprises:
    checking flag data of a selected word line, stored in the flag register, when a most significant bit (MSB) page read operation is performed on the selected word line; and
    performing the read operation by using first and third read voltages when the flag data of the selected word line is second data.

4. The method of claim 1, wherein the storing of the flag data in the RAM and the storing of the flag data in the flag register are performed when power is on.

5. The method of claim 1, wherein the storing of the flag data stored in the RAM, in the flag register in the semiconductor memory device includes storing flag data of a memory block on which the read operation is performed, among the flag data stored in the RAM, in the flag register.

6. The method of claim 5, wherein the reading of the flag data of each word line and the storing of the flag data in the RAM include storing data of a page including the flag data of the memory block on which the read operation is performed.

7. Checking whether flag data read from one memory block among a plurality of memory blocks for each word line is stored in a flag register of a semiconductor memory device;
    performing, at the semiconductor memory device, a most (MSB) page read operation on a selected word line using a controller configured to control operations of the semiconductor memory device when the flag data is not stored in the flag register;
    storing flag data, determined by the MSB page read operation, in the flag register; and
    performing a least significant bit (LSB) page read operation on the selected word line on the basis of the flag data of the selected word line stored in the flag register,
    wherein the one memory block includes the flag data for each word line of the plurality of memory blocks.

8. The method of claim 7, wherein the storing of the flag data, determined by the MSB page read operation, in the flag register includes storing data, read by performing the MSB page read operation by using a first read voltage, as the flag data of the selected word line in the flag register.

9. The method of claim 7, wherein the performing of the LSB page read operation on the selected word line on the basis of the flag data of the selected word line, stored in the flag register, comprises:
    checking the flag data of the selected word line stored in the flag register; and
    performing a read operation by using a first read voltage when the flag data of the selected word line is first data, and performing the read operation by using a second read voltage when the flag data of the selected word line is second data.

10. The method of claim 7, wherein the LSB page read operation is performed on the basis of the flag data, stored in the flag register, when the flag data is stored in the flag register as a result of checking as to whether the flag data is stored in the flag register of the semiconductor memory device.

11. A memory system, comprising:
    a random access memory (RAM);
    a semiconductor memory device, wherein the semiconductor memory device comprises:
    a memory array including a plurality of memory blocks;
    a peripheral circuit configured to read a flag data of the plurality of memory blocks and outputting the flag data to the RAM; and
    a flag register configured to store the flag data; and
    a controller configured to generate a read command and a page address and controlling the RAM to store the flag data and allow the flag register to store the flag data stored in the RAM,
    wherein the peripheral circuit of the semiconductor memory device is configured to perform a read operation on memory cells of a selected page in response to the read command and the page address, on the basis of the flag data stored in the flag register, and
    one memory block among the plurality of memory blocks stores the flag data of each word line of the plurality of memory blocks.

12. The memory system of claim 11, wherein the peripheral circuit is configured to perform the read operation by using a first read voltage when the flag data is first data and performs the read operation by using a second read voltage when flag data of a selected word line is second data, in response to the read command and a least significant bit (LSB) page address.

13. The memory system of claim 11, wherein the peripheral circuit is configured to perform the read operation by using first and third read voltages when the flag data is second data, in response to the read command and a most significant bit (MSB) page address.

14. The memory system of claim 11, wherein the flag data of each word line is stored in the RAM and the flag register when power is on.

15. The memory system of claim 11, wherein the controller is configured to control the RAM so that flag data of each word line of a memory block on which the read operation is performed among the flag data, stored in the RAM, is stored in the flag register.

16. The memory system of claim 15, wherein the semiconductor memory device is configured to store flag data of a page including the flag data of the memory block, on which the read operation is performed, in the RAM.

* * * * *